United States Patent [19]
Kuglin et al.

[11] Patent Number: 6,009,546
[45] Date of Patent: Dec. 28, 1999

[54] ALGORITHMIC PATTERN GENERATOR

[75] Inventors: Philip Theodore Kuglin, Tualatin, Oreg.; Algirdas Joseph Gruodis, Wappinger Falls, N.Y.

[73] Assignee: Credence Systems Corporation, Fremont, Calif.

[21] Appl. No.: 09/126,691

[22] Filed: Jul. 30, 1998

[51] Int. Cl.[6] .................................................. G01R 31/28
[52] U.S. Cl. ........................ 714/738; 714/743; 714/744; 324/73.1
[58] Field of Search ................................... 714/738, 742, 714/743, 744, 724, 728, 718, 38; 365/201; 324/73.1

[56] References Cited

U.S. PATENT DOCUMENTS

| | | | |
|---|---|---|---|
| 4,402,081 | 8/1983 | Ichimiya et al. ........................ | 714/718 |
| 4,862,067 | 8/1989 | Brune et al. . | |
| 4,931,723 | 6/1990 | Jeffrey et al. . | |
| 5,018,145 | 5/1991 | Kikuchi et al. ........................ | 714/738 |
| 5,257,359 | 10/1993 | Blasco et al. ........................ | 395/425 |
| 5,481,549 | 1/1996 | Tokuyama .............................. | 714/738 |
| 5,615,218 | 3/1997 | Tsurumi .................................. | 714/738 |
| 5,673,271 | 9/1997 | Ohsawa .................................. | 714/718 |

*Primary Examiner*—Hoa T. Nguyen
*Attorney, Agent, or Firm*—Smith-Hill and Bedell

[57] ABSTRACT

An algorithmic pattern generator produces an output data value during each cycle of a clock signal. The pattern generator includes an addressable instruction memory reading out an instruction during each clock signal cycle. A memory controller normally increments the instruction memory's address during each clock signal cycle, but may jump to another address N+1 clock signal cycles after receiving a CALL, RETURN, REPEAT or BRANCH command from an instruction processor. The instruction processor normally executes the instruction read out of the instruction memory during each clock signal cycle and provides a data field included in the executed instruction as the pattern generator's output data. Other fields of the instruction reference a command the instruction processor sends to the memory controller. Since the memory controller requires N+1 clock signal cycles to respond to a command, it continues to increment the instruction memory address for N clock signal cycles after receiving the command before it actually performs an address jump. Instead of the N instructions read out of instruction memory during the N clock signal cycles after sending a jump command, the instruction processor executes an appropriate set of N instructions pre-loaded into an auxiliary buffer memory. During the next clock signal pulse thereafter, when the memory controller has had time to make the address jump, the instruction processor resumes executing instructions read out of the instruction memory.

16 Claims, 7 Drawing Sheets

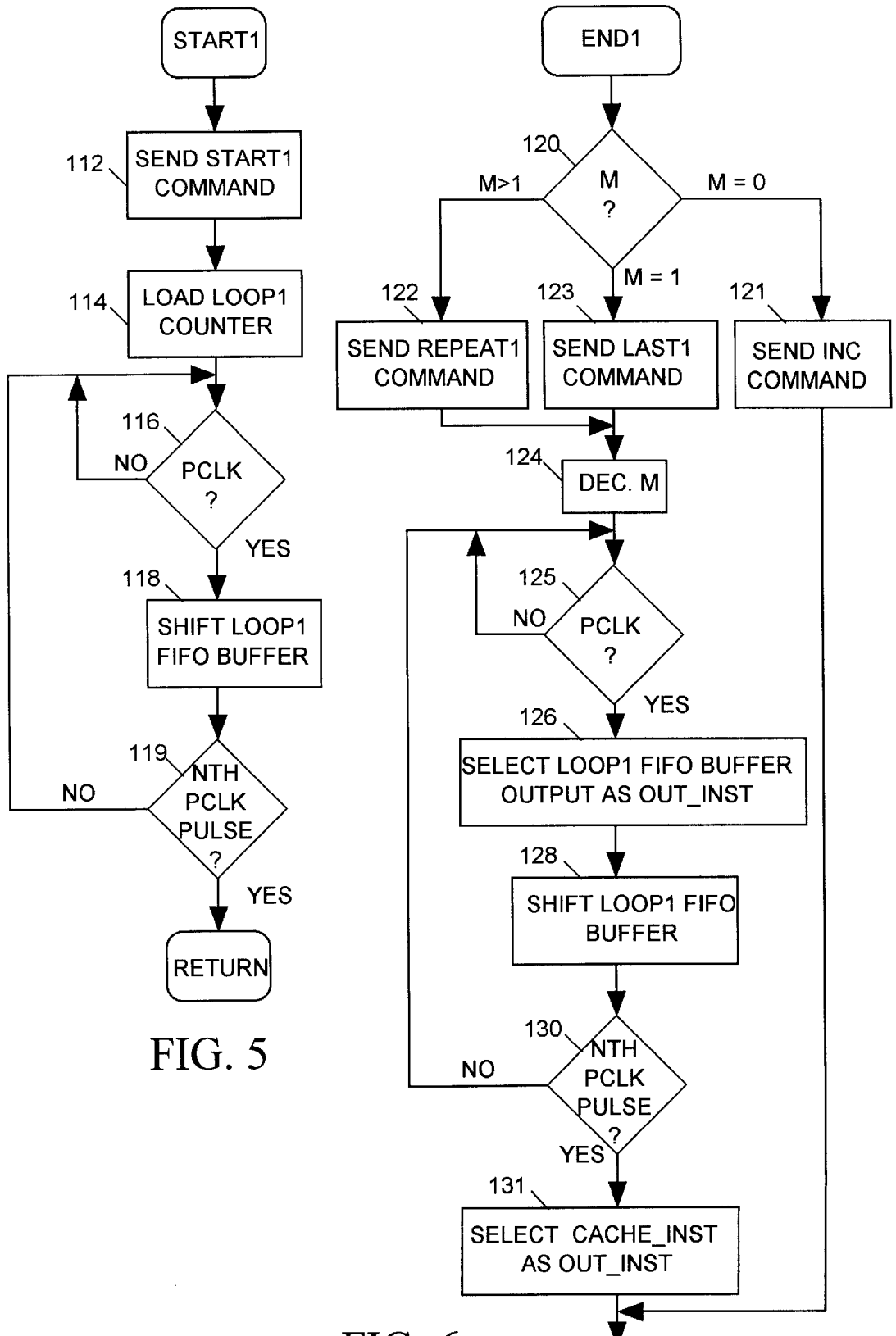

ALGORITHMIC PATTERN GENERATOR

BACKGROUND OF THE INVENTION

1. Field of the Invention

The present invention relates to an algorithmic pattern generator.

2. Description of Related Art

Integrated circuit (IC) tests are typically organized into a succession of test cycles. An IC test is normally defined by a separate sequence of data values (vectors) for each pin of an IC device under test (DUT), with each vector indicating the test activities to be carried out at a DUT pin during a test cycle. A typical integrated circuit (IC) tester includes a separate tester channel for each DUT pin. Each tester channel includes a pin testing circuit for carrying out the test activities indicated by the channel's vector sequence and a memory for storing and reading out vectors to the pin testing circuit. A central pattern generator provide an address to each vector memory in response to each pulse of a clock signal, and the vector memory of each channel reads out an addressed vector to the channel's pin testing circuit. Integrated circuit testers with distributed pattern generators don't use a central pattern generator; they employ a separate pattern generator in each tester channel for directly generating vectors.

Many types of pattern generators are known. A simple pattern generator includes a random access memory storing a data value at each address and a counter for incrementing the memory's address in response to each pulse of a clock signal, thereby causing the memory to read out a data sequence from successive addresses. Such pattern generators have been employed in integrated circuit testers, but as ICs have grown in size and complexity, so too have the size of the vector sequences needed to define IC tests. This has required an increase in the size of the pattern generator and vector memories. Also as the operating frequency of ICs have continued to increase, the test cycle period has decreased. Since a pattern generator must supply a data output at the start of each test cycle, the higher test frequencies require faster vector memories. But large and fast memories are expensive.

Algorithmic Pattern Generators

Since many tests require repeating patterns of vectors, prior art integrated circuit testers have employed algorithmic pattern generators to reduce the amount of data that must be stored. U.S. Pat. No. 4,862,067 issued Aug. 29, 1989 to Brune et al discloses an IC tester employing an algorithmic pattern generator including a vector memory and a memory controller. The vector memory stores both a vector and an instruction at each address. The memory controller addresses the memory before the start of each test cycle and forwards the vector read out of the vector memory to the pin testing circuits. The instruction read out of the vector memory tells the memory controller how to choose the next vector memory address. This vector memory architecture allows instructions telling the memory controller to repeat vector sequences using loops and calls. The memory controller may also be instructed to perform a conditional branch when a signal from the pin testing circuits indicates the DUT output signal meets some criteria. While Brune's system reduces the size of vector memory needed, it requires a fast vector memory having an access time no longer than the period of a test cycle. It also requires that the instruction processor be able to execute an instruction in one test cycle. Thus either the memory access speed or the instruction processing time may limit the frequency at which Brune's system can operate.

Cache Memories

A large dynamic random access memory (DRAM) is inexpensive but it's too slow to be accessed during each test cycle of a high-speed IC test. Some integrated circuit testers reduce memory costs by using a large DRAM to supply data to a small, high-speed cache memory. In such a system, vectors (or vector memory addresses) for N successive test cycles are stored at each memory location of a DRAM. The vector output of the DRAM is written into a high-speed cache memory at a rate that is 1/Nth of the test frequency. The high-speed cache memory then reads out vectors (or vector memory addresses), one at a time, at the required test frequency rate.

It would be desirable to provide a pattern generator for an integrated circuit tester that generates its output vector or address pattern algorithmically and which also uses caching to allow use of lower speed main memories. U.S. Pat. No. 4,931,723 issued Jun. 5, 1990 to Jeffery et al employs a relatively low-speed vector memory storing eight 10-bit vectors as one 80-bit word at each vector memory address. Each 80-bit word read out of the vector memory is shifted into an 80-bit shift register. The shift register which, acting like a small cache memory, shifts out a 10-bit vector to a pin testing circuit at the start of each test cycle.

Jeffery's system is capable of limited algorithmic vector generation in that it can repeat sequences of instructions. Only the first instance of a repeating vector pattern is stored in the vector memory. Upon encountering that first instance of that pattern during the test, a vector memory controller, in addition to sending the pattern to the pin testing circuits, also saves that instance of the vector pattern in (another) cache memory. Thereafter, when the controller reaches the end of a loop, it starts reading the vectors out of the cache memory instead of the vector memory, and can do so as many times as the pattern "loop" is to be repeated.

In order to repeat a sequence of instructions, the memory controller has to know the starting and ending vector memory addresses of the loop as well as the number of times the loop is to be repeated. In Jeffery's system, loop start and loop end instructions are inserted into the vector sequence. Thus at the start of a test signal in which a loop begins or ends, the vector memory reads out an instruction instead of a vector. Since a vector has to be provided to the pin testing circuit at the start of every test cycle, the appearance of a loop instruction causes a gap in the vector sequence. Jeffery uses the cache memory to solve this problem.

Before the start of a test, the vector memory controller receives an instruction indicating the positions in the vector sequence output of the vector memory of starting and ending vectors of the first loop as well as the number of repetitions to be performed. During the test, when the vector memory controller encounters the first vector of the first loop, it begins storing vectors of the loop in the cache memory until it reaches the last vector of the loop. At that point it begins reading the vectors out of the cache memory instead of reading them out of the vector memory. An instruction indicating the starting and ending addresses and length of the second loop is stored in the vector memory immediately following the last vector of the first loop. During the second pass though the first loop, while the memory controller is reading vectors out of the cache memory, the memory controller also reads the instruction for the second loop out of the vector memory. Thus the cache memory provides the memory controller with an alternate source of vectors during the time that it is reading a next loop instruction out of the vector memory. This eliminates the gap in the vector sequence caused by the inserted loop instruction. While Jeffery's system takes advantage of both memory caching and algorithmic pattern generation, its algorithmic pattern generation capability is rather limited. Jeffery's system can only perform loops; it cannot perform subroutine calls or conditional branches.

Pipeline Instruction Processors

Some pattern generators include an instruction processor and a memory with instruction and pattern data concurrently stored at each memory address. When an instruction/pattern data pair is read out of the memory, the pattern data provides the pattern generator output. The instruction tells an instruction processor how to select the memory address of the next instruction/pattern data pair to be read out. Such pattern generators can employ a wide variety of instructions including calls, returns, branches, loops etc. However since an instruction processor must decode the instruction at the start of a test cycle and be ready to jump to a new memory address by the start of the next test cycle, the speed at which the memory controller can decode instructions can limit the pattern generator's operating frequency.

In some applications, high-speed instruction processors employ a pipeline architecture to decode and execute instructions. In a pipeline processor instructions are sequentially clocked through many processing stages, with successive instructions being concurrently processed by successive pipeline stages. Since the amount of processing each stage requires to process an instruction is relatively short, the clock signal clocking the instructions through the stages may be of relatively high frequency. Although the total time required for all pipeline stages to fully process an instruction may be relatively long, the instruction processor can complete processing an instruction on each pulse of the clock signal. Thus the pipeline processor processes instructions at the high clock frequency.

Although they can processes instructions at high frequency, pipeline instruction processors have not been used in pattern generators. Assume, for example, that a pipeline instruction processor normally reads vectors sequentially out of a vector memory at the start of each test cycle, but may jump to some other memory address in response to an instruction such as a branch, call or return requiring an address jump. Suppose also that a pipelined instruction processor requires N clock cycles to fully process an instruction. When the instruction processor encounters an instruction requiring an address jump, we want the processor to make the jump immediately in the next test cycle in order to maintain the continuity of the pattern generator output. But since it actually requires N test cycles to make the jump, the processor will continue to read instructions stored in the next N memory addresses. That extra set of N instructions causes a sequence of N pattern data values to be inserted into the pattern generator's output data sequence.

What is needed is an algorithmic pattern generator employing a cache memory system and which uses a pipeline instruction processing architecture without inserting extra data into its output data pattern prior to each memory address jump.

SUMMARY OF THE INVENTION

An algorithmic pattern generator in accordance with the present invention produces an output data value during each cycle of a high frequency clock signal. The pattern generator includes a memory controller and an addressable instruction memory for reading out an addressed instruction to the memory controller during each clock signal cycle. The memory controller normally increments the instruction memory read address during each clock signal cycle, but may jump to another address N+1 clock signal cycles after receiving a CALL, RETURN, REPEAT or BRANCH command from an instruction processor. The instruction processor normally executes the instruction read out of the instruction memory during each clock signal cycle and provides a data field included in the executed instruction as the pattern generator's output data. Other fields of the instruction reference the command the instruction processor is to send to the memory controller. Since the memory controller requires N+1 clock signal cycles to respond to a command, it continues to increment the instruction memory address for N clock signal cycles after receiving a jump command before it actually performs the address jump.

The pattern generator includes an auxiliary buffer memory pre-loaded with an appropriate set of N instructions to be executed during the N clock cycles after the instruction processor sends an address jump command to the memory controller. During those N cycles, the instruction processor executes N instructions stored in the auxiliary buffer memory instead of the instructions read out of instruction memory. On the next clock signal pulse thereafter, when the memory controller has had time to make the address jump, the instruction processor resumes executing instructions read out of the instruction memory.

It is accordingly an object of the invention to provide an pattern generator that algorithmically generates a VECTOR data value in response to each pulse of a clock signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates an algorithmic pattern generator in accordance with the present invention in block diagram form, FIGS. 2–7 are flow charts illustrating operations of the state machine of FIG. 1, FIG. 8 illustrates the memory controller of FIG. 1 in more detailed block diagram form, and FIG. 9 illustrates the command processor of FIG. 8 in more detailed block diagram form.

DESCRIPTION OF THE PREFERRED EMBODIMENT(S)

Figure 1:
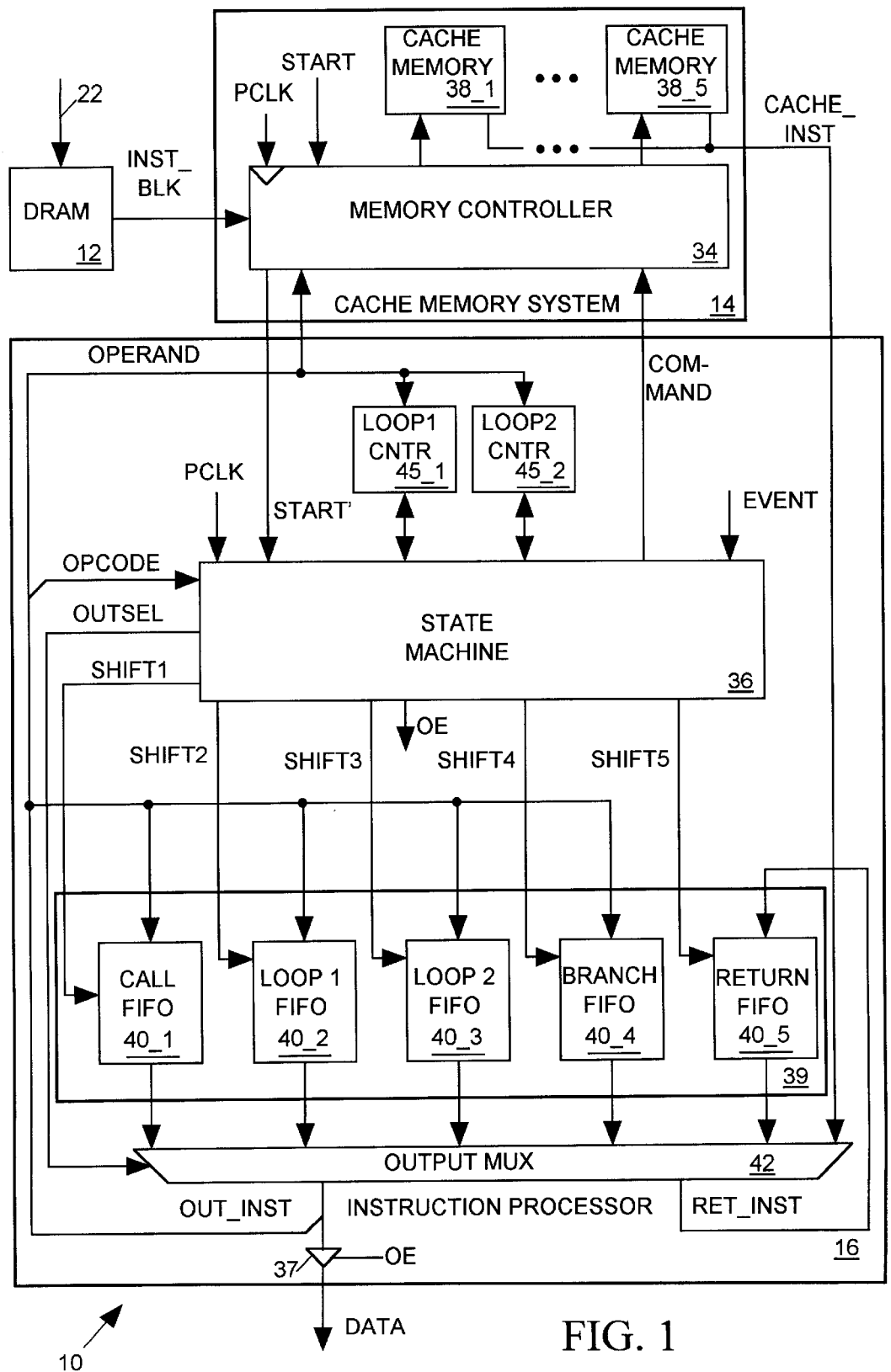

FIG. 1 illustrates an algorithmic pattern generator 10 in accordance with the present invention. Pattern generator 10 includes a large, dynamic random access memory (DRAM) 12, a cache memory system 14, and an instruction processor 16. An external host computer (not shown) write accesses the DRAM 12 via a bus 22. A cache memory system 14 read accesses DRAM 12. To program pattern generator 10, the host computer writes a block of 16 instructions into each address of DRAM 12. To start pattern generation, the host computer transmits a START signal to a memory controller 34 within cache memory system 14. In response to the START signal, memory controller 34 begins reading blocks of instructions (INST_BLK) out of successive addresses of DRAM 12 and storing individual instructions thereof at successive addresses within a set of five cache memories 38_1 through 38_5. When it has filled cache memories 38 with instructions read out of DRAM 12, memory controller 34 transmits a START signal to instruction processor 16 telling it that cache memory system 14 is to begin reading out instructions. Thereafter, on each pulse of an externally generated periodic clock signal (PCLK), memory controller 34 read enables and addresses one of cache memories 38 causing that cache memory to read out and forward an addressed instruction (CACHE_INST) to instruction processor 16.

Cache memories 38_1–38_3 store main program instructions. To read out main program instructions, memory controller 34 sequentially read addresses each cache memory 38_1–38_3 in turn and thereafter begins sequentially addressing cache memory 38_1 again. After read accessing the last address of any one of cache memories 38_1–38_3, memory controller 34 normally transfers a new block of instructions into that cache memory from DRAM 12.

Cache memory 38_4 is reserved for storing a subroutine and cache memory 38_5 is reserved for storing the first several instructions of a program branch. As discussed in more detail below, memory controller 34 transfers the subroutine from DRAM 12 to cache memory 38_4 and transfers the first several instructions of a program branch to cache memory 38_5 after receiving the START signal. That subroutine and branch instructions remain in cache memories 38_4 and 38_5 so that they are immediately available in the cache memory whenever called by the main program.

Cache memory system 14 reads an instruction out of one of cache memories 38_1–38_5 during each PCLK signal cycle and supplies that instruction (CACHE_INST) to instruction processor 16. DRAM 12 is a large, relatively low cost, but slow memory which cannot read out data at the high frequency of the PCLK signal. But since DRAM 12 holds sixteen instructions at each address, it can read out blocks of instructions at a lower frequency while still providing an average of one instruction for each cycle of the PCLK signal. Cache memories 38_1–38_5, on the other hand, are relatively small and expensive for the number of instructions they hold, but they can read out individual instructions at the high PCLK signal frequency.

On each pulse of the PCLK signal, instruction processor 16 executes an instruction telling it to send a command to memory controller 34. Most instructions tell instruction processor 16 to send an increment command (INC) to memory controller 34 telling it to increment the cache memory address. However some commands tell memory controller 34 to jump to a particular cache memory address. For example a subroutine call command (CALL) tells memory controller 34 to store the current cache memory read address and to thereafter jump to the first address of cache memory 38_4. A subroutine return command (RETURN) tells memory controller 34 to return to a next main program address after the last instruction of the called subroutine has been read out of cache memory 38_4 and executed. Other commands requiring address jumps are described below.

Each output instruction (CACHE_INST) of cache memory system 14 includes OPCODE, OPERAND and DATA fields. During each cycle of the PCLK signal, instruction processor 16 normally executes the instruction output of cache memory system 14, providing the executed instruction's DATA field as the DATA output of the pattern generator. The OPCODE field of each instruction references the particular command that instruction processor 16 is to send to memory controller 34. The information conveyed in the OPERAND field of an instruction depends on the OPCODE. When an OPCODE indicates that the current instruction is the first instruction of a sequence of instructions (a loop) to be repeated, the OPERAND indicates the number of times the loop is to be repeated. When an OPCODE indicates that memory controller 34 is to perform a branch, the OPERAND indicates the DRAM 12 memory address to which the memory controller 34 is to branch. In such case the instruction processor forwards the OPERAND to memory controller 34 with the branch command.

Delayed Address Jumping

Ideally we would like memory controller 34 to immediately jump to the correct cache memory address in response to the next PCLK signal after receiving a command from instruction processor 16 requesting such an address jump. However since pattern generator 10 operates at very high PCLK signal frequencies, there isn't enough time during one PCLK signal cycle for cache memory system 14 to respond to a command. Cache memory system 14 therefore employs a pipeline architecture to process incoming commands from instruction processor 16. Due to its pipeline architecture memory controller 34 requires N PCLK signal cycles (where N is greater than 1) to process an incoming command, make an address jump required by that command, and deliver the instruction at the jump address to instruction processor 16.

Assume, for example, that memory controller 34 is currently addressing some cache memory address X when it receives a command to jump to some address Y. During the N PCLK pulses memory controller 34 requires to process the jump command, it reads out the sequence of N instructions stored at cache memory addresses X+1 though X+N. It is only on the (N+1)th PCLK signal pulse after receiving the command to jump to address Y that cache memory controller 34 actually jumps to address Y. Thus after sending a command calling for an address jump to memory controller 34, instruction processor 16 must wait N+1 cycles to receive the instruction stored at the jump address Y. In the meantime, instruction processor 16 receives the N instructions stored at cache memory addresses (X+1) through (X+N). However these are not the instructions that should be executed during those N PCLK cycles. Instruction processor 16 resolves this problem with the help of a buffer memory 39.

Buffer memory 39 includes a set of first-in/first-out (FIFO) buffers 40_1–40_5, each of which may store a sequence of N instructions. An instruction output of each FIFO buffer 40 as well as instruction outputs of cache memory system 14 drive separate inputs of an output multiplexer 42 controlled by a control data output (OUTSEL) of a state machine 36. Output multiplexer 42 can select any one of its input instructions as its output instruction (OUT_INST). The DATA field of the output instruction OUT_INST constitutes the output data of pattern generator 10. The OPCODE field of the OUT_INST instruction provides an input to state machine 36. The OPERAND field of OUT_INST provides a data input to a pair of counters 45_1 and 45_2 and also forms a part of the command that instruction processor 16 sends to memory controller 34.

Subroutine Instruction Loading

As mentioned above, cache memory 38_4 stores subroutine instructions. Actually it stores all but the first N instructions of the subroutine. During the programming phase, the host computer writes the subroutine into the first several addresses of DRAM 12. After the host computer sends the START signal to memory controller 34, memory controller 34 reads the subroutine out of DRAM 12, writes the first N subroutine instructions to the first N addresses of cache memory 38_1 and writes the remaining subroutine instructions to cache memory 38_4.

After filling the remaining portions of cache memories 38_1–38_3 with main program instructions, controller 34 sends a START' signal to state machine 36 and begins read addressing cache memory 38_1 to send instructions to instruction processor 16. Cache memory system 14 therefore initially reads out the first N instructions of the subroutine and sends them to instruction processor 16.

After receiving the START' signal, state machine 36 sets the OUTSEL control data input to multiplexer 42 so that it delivers the cache memory system 14 output instructions to FIFO buffer 40_1. State machine 36 then pulses a SHIFT1 signal in response to each of the first N pulses of the PCLK signal following the START' signal pulse, thereby shifting the first seven CACHE_INST instructions into FIFO buffer 40_1. State machine 36 then pulses a SHIFT4 output signal in response to the next N PCLK pulses to load the second set of N cache memory output instructions into FIFO buffer 40_4. Thus the "CALL" FIFO buffer 40_1 stores the first N instructions of a subroutine.

Branch Instruction Loading

During program execution, when memory controller 34 is commanded to branch to some DRAM memory address, it has to read a blocks of instructions out of DRAM 12 at the selected memory address, write them into cache memory 38_1, and then begin reading the instructions out of the cache memory and sending them to instruction processor 16. Since memory controller 34 can't do this in one cycle, instruction processor 16 obtains the first N instructions of the branch from FIFO buffer 40_4. Memory controller 34 loads these N instructions into FIFO buffer 40_4 during system start up. Cache memory controller 34 also loads the next M instructions of the branch into cache memory 38_5 on system startup. The value of M is selected to be the number of system clock cycles that memory controller 34 needs to read several blocks of instructions out of DRAM 12 and write them into cache memory 38.

Prior to system start up the host computer writes the first N+M instructions of the branch sequence into DRAM 12 immediately following the subroutine instructions. After receiving the START command, and after moving the first N subroutine instructions from DRAM 12 to FIFO buffer 40_1 and the remaining subroutine instructions into cache memory 38_4, memory controller 34 moves the first N branch instructions into the second set of N address of cache memory 38_1 and writes the next M instructions of the branch into cache memory 38_5. It then pulses the START' signal and begins reading instructions out of cache memory 38_1 and sending them to instruction processor 16. Processor 16 stores the first N instructions it receives in the CALL FIFO buffer 40_1 and stores the next N instructions it receives in the BRANCH FIFO buffer 40_4.

Pattern generator 10 begins producing its output pattern on the (2N+1)th pulse of the PCLK signal after memory controller 34 asserts the START' signal. At that point state machine 36 sets output multiplexer 42 to select the next instruction output CACHE_INST of cache memory system 14 and asserts a signal OE to output enable a driver 37. Driver 37 delivers the DATA field of the currently executed instruction (OUT_INST) as the pattern generator output data. Thereafter, until it receives an instruction OPCODE telling it to do otherwise, state machine 36 continues to select cache memory system output instructions CACHE_INST as the currently executed instruction OUT_INST.

CALL and RETURN Instruction Processing

When the OPCODE of the current OUT_INST instruction indicates that memory controller 34 is to jump to the first address of cache memory 38_4 storing all but the first N subroutine instructions, state machine 36 sends a CALL command to memory controller 34. At the same time state machine 36 switches output multiplexer 42 so that it selects the instruction output of the CALL FIFO buffer 40_1 instead of the CACHE_INST output of memory controller 34. State machine 36 also sets the OUTSEL signal to switch a multiplexer 42 so that it begins routing the CACHE_INST output of cache memory system 14 to a "RETURN" FIFO buffer 40_5. In response to each of the next N PCLK signal pulses, state machine 36 pulses the SHIFT1 and SHIFT5 signals to shift instructions through FIFO buffers 40_1 and 40_5. Since CALL FIFO 40_1 has been pre-loaded with the first N instruction of the subroutine, those first N subroutine instructions shift out of FIFO buffer 40_1 and pass through output multiplexer 42 to become the next N executed instructions OUT_INST. The SHIFT1 signal also shifts those N OUT_INST back into CALL FIFO buffer 40_1 so that they will be available in that FIFO buffer should the subroutine be called again. The SHIFT5 signal output of state machine 36 shifts the next N CACHE_INST instructions from cache memory system 14 into the RETURN FIFO 40_5. Since those are the first N instructions stored in cache memory following the instruction that initiated the subroutine call, they must be the first N instructions instruction processor 16 must later execute when the program returns from the called subroutine.

On the (N+1)th pulse of the PCLK signal after state machine 36 transmits the CALL command, the state machine switches output multiplexer 42 to again select the CACHE_INST output of cache memory system 14. By that time, memory controller 34 has responded to the CALL command and is now reading addressing the first address of cache memory 38_4 which contains the (N+1)th instruction of the subroutine. Thereafter, memory controller 34 continues to sequentially address cache memory 38_4 until it receives and processes a RETURN command from state machine 36.

The last instruction of the subroutine stored in cache memory 38_4 includes a "RETURN" OPCODE. When state machine 36 detects the RETURN OPCODE it sends a RETURN command to memory controller 34 telling it to return from the subroutine jump. During the first N cycles after receiving the RETURN OPCODE, state machine 36 switches output multiplexer 42 to select the N instructions stored in RETURN FIFO buffer 40_5. In the meantime, until it has sufficient time to process the RETURN command, memory controller 34 continues to sequentially address cache memory 38_4 reading out whatever instructions happen to be stored in the N addresses following the RETURN instruction. Instruction processor 16 receives but does not save or execute those instructions.

When memory controller 34 makes the address jump in response to the CALL command, it saves its current cache address X. Since memory controller 34 required N+1 cycles to respond to the CALL command, address X refers to an address that is N+1 greater than the cache memory address at which the CALL instruction was stored. Since memory controller 34 also requires N+1 cycles to respond to the RETURN command, it jumps to cache memory address X+N+1 containing the (N+1)th main program instruction to be executed after the RETURN command. Thus on the (N+1)th PLCK signal pulse following its detection of the RETURN OPCODE, as the cache memory system 14 reads out the instruction at address X+N+1, state machine 36 switches output multiplexer 42 to select the cache memory system output instruction CACHE_INST as the current OUT_INST.

Branch Instruction Processing

State machine 36 may receive an OPCODE telling it to send a BRANCH command to memory controller 34 if an externally generated EVENT signal input to state machine 36 is currently asserted. The BRANCH command tells memory controller 34 to branch to some DRAM 12 address indicated by the OPERAND accompanying the OPCODE. The OPERAND is forwarded to memory controller 34 with the BRANCH command.

After sending the BRANCH command to memory controller 34, state machine 36 switches output multiplexer 42 so that it selects the output of FIFO buffer 40_4 during the next N PCLK signal cycles. Responding to each of the next N PCLK signal pulses thereafter, state machine 36 pulses its SHIFT4 output to shift out the first N instructions stored in FIFO buffer 40_4 to provide the next N OUT_INST instructions to be executed. Thereafter state machine 36 switches output multiplexer 42 to resume selecting the CACHE INST output of memory controller 34 as the source of executed OUT_INST instructions. In the meantime, memory controller 34 has the required N+1 PLCK signal cycles to make the jump to the first address of cache memory 38_5 which stores the next M instructions of the branch. During the next M PCLK signal cycles, while reading those M instructions out of cache memory 38_5, memory controller 34 begins transferring instructions from DRAM 12 into cache memories 38_1–38_3 starting with the DRAM 12 address containing the (N+M+1)th instruction after the branch address identified by the operand. After reading out the last of the M instructions stored in cache memory 38_5, memory controller 34 jumps to the first address of cache memory 38_1 containing the next instruction of the branch.

LOOP Instructions

Pattern generator 10 is capable of executing two levels of nested instruction loops and accordingly employs two sets of loop instructions, LOOP1_START/LOOP1_END and LOOP2_START/LOOP2_END.

A LOOP1_START or LOOP2_START OPCODE in the current OUT_INST instruction indicates that the current OUT_INST instruction is the first of a sequence of instructions to be repeated M times. The accompanying OPERAND indicates the value of M. On detecting a LOOP1_START or LOOP2_START OPCODE, state machine 36 sends START1 or START2 command to memory controller 34 and loads the OPERAND value M into a corresponding LOOP1 counter 45_1 or a LOOP2 counter 45_2. During the next N test cycles, state machine 36 shifts the next N OUT_INST instructions into either the "LOOP1" FIFO buffer 40_2 or the "LOOP2" FIFO buffer 40_3. On the (N+1)th PCLK signal pulse, memory controller 34 responds to the START1 or START2 command by storing the current memory address in an internal register.

The last instruction of the sequence of instructions to be repeated includes a "LOOP1_END" or "LOOP2_END" OPCODE telling state machine 36 to decrement LOOP1 or LOOP2 counter 45_1 or 45_2. If the counter's output has not yet reached 1, state machine 36 sends a REPEAT1 or REPEAT2 command to memory controller 34 and switches output multiplexer 42 so that it selects the instruction output of the LOOP1 LOOP2 FIFO buffer 40_2 or 40_3.

During the next N cycles, until memory controller 34 has had time to process the REPEAT1 or REPEAT2 command, state machine 36 shifts the first N instructions of the loop out of the appropriate LOOP1 or LOOP2 FIFO buffer 40_2 or 40_3 so that they appear as the next N OUT_INST instructions. State machine 36 also shifts the next N OUT_INST instructions back into the same FIFO buffer 40_1 or 40_2 so they will be available for the next repetition of the loop. On the (N+1)th cycle after receiving the REPEAT1 or REPEAT2 command, memory controller 34 jumps to the cache address it saved in response to the START1 or START2 command. Cache memory system 14 thereupon reads out the (N+1)th instruction of the instruction loop. At that time state machine 36 switches output multiplexer 42 so that it selects the CACHE_INST output of memory controller 34.

The process continues until state machine 36, upon receiving a LOOP1_END or LOOP2_END OPCODE at the end of the loop, detects that the output count of the LOOP1 or LOOP2 counter has reached 1 indicating that the next repetition of the loop is the last repetition. At that point state machine 36 sends an "END1" or "END2" command to memory controller 34 instead of a REPEAT1 or REPEAT2 command. Memory controller 34 responds to the END1 and END2 command in the same way it responds to a REPEAT1 or REPEAT2 command. However the END1 or END2 tells memory controller 34 that it is now free to move write instructions from DRAM 12 into the cache memory storage locations containing the loop instructions after the loop instructions have been executed one more time.

Upon encountering a LOOP1_END or LOOP2_END instruction at the end of the last repetition of the loop, state machine 36 detects that the output M of loop counter 45_1 or 45_2 is zero. At that point state machine 36 sends an INC command to memory controller 34 and continues to set output multiplexer 42 so that it selects CACHE_INST instruction output of cache memory system 14.

Instruction Processor State Machine.

Figure 2:
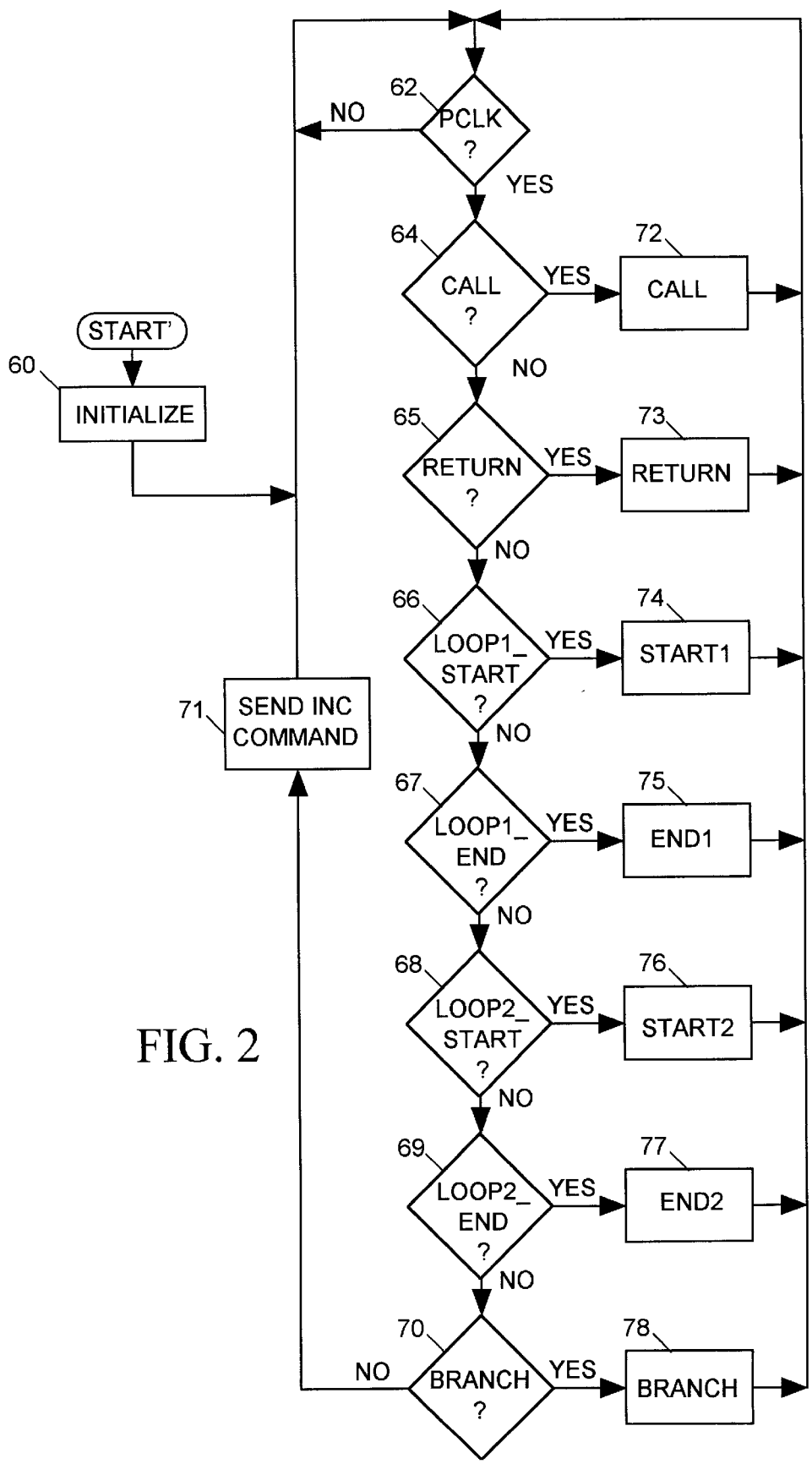

FIG. 2 illustrates operation of state machine 36 of instruction processor 16 of FIG. 1 in flow diagram form. After being reset by the START' signal, state machine 36 executes an "initialize" routine (step 60) in which it responds to the next 2N PCLK signal pulses by loading the first N CACHE_INST instructions into CALL FIFO buffer 40_1 and BRANCH FIFO buffer 40_4 in the manner described above. After detecting the PCLK signal pulse (step 62), state machine 36 checks whether the next received OPCODE is a CALL, RETURN, LOOP1_START, LOOP1_END, LOOP2_START, LOOP2_END, or BRANCH instruction (steps 64–70). If not, state machine 36 transmits an increment (INC) command to memory controller 34 (step 71) and returns to step 62 to await a next PCLK signal pulse. If at any of steps 64–70, state machine 36 detects one of the aforementioned OPCODEs, it executes a corresponding routine at one of steps 72–78 and then returns to step 62 to await the next PCLK signal pulse.

Figures 3, 4:
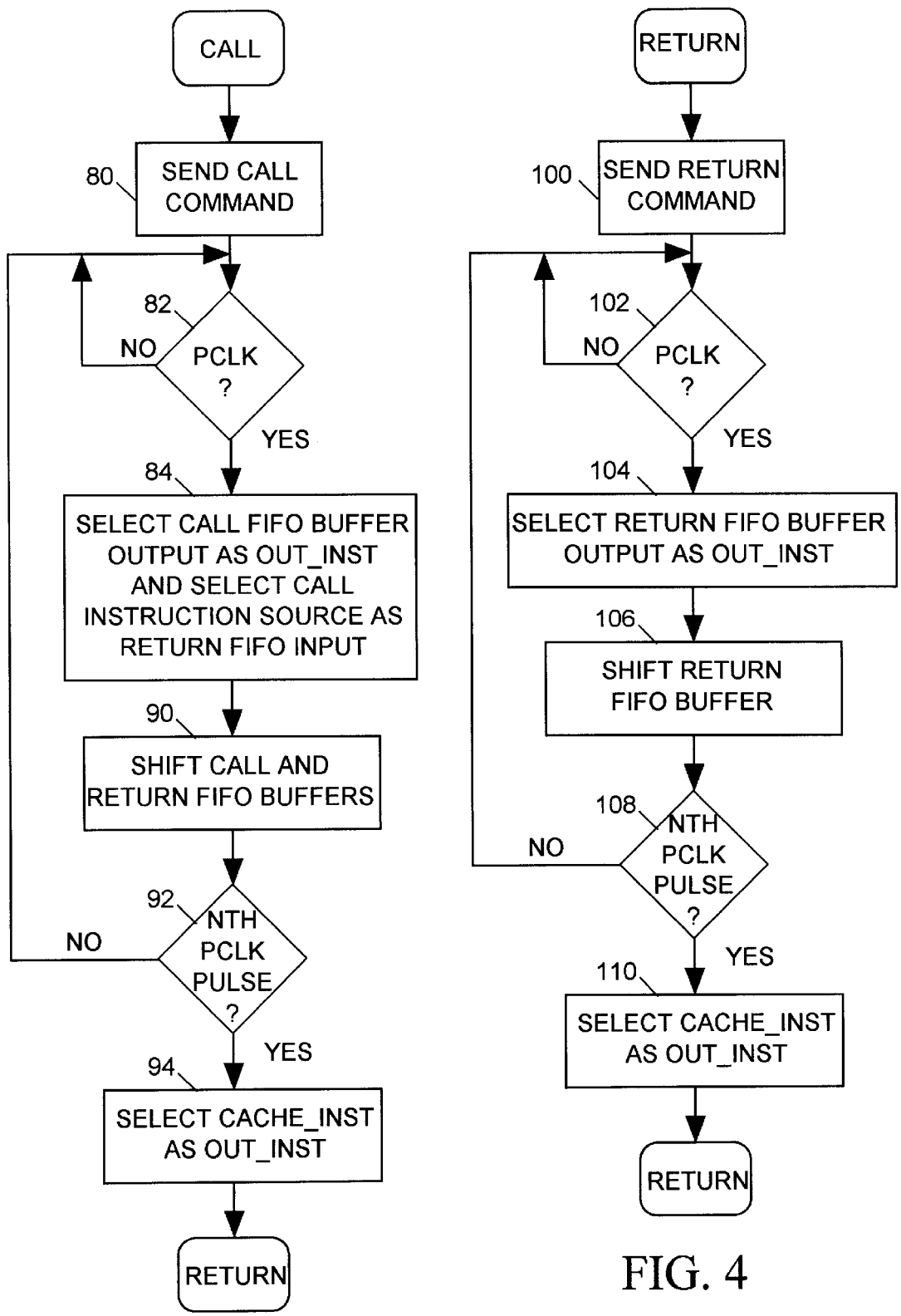

FIG. 3 illustrates a CALL routine state machine 36 executes at step 72 of FIG. 2 when the current OUT_INST instruction is a CALL instruction. State machine 36 initially sends a CALL command to memory controller 34 (step 80) and then waits for a next PCLK signal pulse (step 82). It then sets output multiplexer 42 to select the output of call FIFO buffer 40_1 as OUT_INST instruction source and to select the source of the CALL instruction as the input to return FIFO buffer 40_5 (step 84). State machine 36 then pulses the SHIFT1 and SHIFT4 signals to shift instructions into and out of the call and return FIFO buffers 40_1 and 40_5 (step 90). If (at step 92) state machine 36 has not detected N PCLK pulses since receiving the CALL instruction, state machine 36 returns to step 82. State machine 36 loops through steps 82–92 N times until it has shifted the first N instructions of the subroutine out of call FIFO 40_1. At that point (step 94) state machine 36 switches output multiplexer 42 to forward CACHE_INST as OUT_INST. The CALL routine then returns to the main routine of FIG. 2.

FIG. 4 illustrates a RETURN routine state machine 36 executes at step 73 of FIG. 2 when the current OUT_INST instruction is a RETURN instruction. State machine 36 initially sends a RETURN command to memory controller 34 (step 100) and then waits for the next PCLK signal pulse (step 102). It then sets output multiplexer 42 to select the output of return FIFO buffer 40_5 as OUT_INST instruction source (step 104), then pulses the SHIFT1 and SHIFT5 signal to shift instructions out of the return FIFO buffer 40_5 (step 106). If (at step 108) state machine 36 has not detected N PCLK pulses since receiving the RETURN instruction, state machine 36 returns to step 102. State machine 36 loops through steps 102–108 N times until it has shifted N instructions of return FIFO 40_5. At that point (step 110) state machine 36 switches output multiplexer 42 to forward CACHE_INST as OUT_INST. The RETURN routine then returns to the main routine of FIG. 2.

FIG. 5 illustrates the START1 routine state machine 36 executes at step 74 of FIG. 2 when the current OUT_INST instruction is a LOOP1_START instruction. (The START2 routine state machine 36 executes at step 76 is generally similar.) State machine 36 initially sends a START1 command to memory controller 34 (step 112) and signals LOOP1 counter 45_1 of FIG. 1 to load the OPERAND as the number M of repetitions of the loop to be performed (step 114). State machine 36 then waits for a next PCLK signal (step 116) and upon detecting that next PCLK signal pulse, it shifts the current OUT_INST into the LOOP1 FIFO buffer 40_2 (step 118). If (at step 119) state machine 36 has not detected N PCLK pulses since receiving the LOOP_START1 instruction, state machine 36 returns to step 116. State machine 36 loops through steps 116–119 N times until it has shifted N instructions into the LOOP1 FIFO buffer 40_2. At that point the START1 routine then returns to the main routine of FIG. 2.

FIG. 6 illustrates the END1 routine state machine 36 executes at step 75 of FIG. 2 when the current OUT_INST instruction is a LOOP1_END instruction. (The END2 routine state machine 36 executes at step 77 is generally similar.) If the output value M of LOOP1 counter 45_1 is 0 (step 120), indicating that the last repetition of the loop has been completed, state machine 36 transmits an increment (INC) command to memory controller 34 (step 121) and then returns to the main routine. If the value of M is greater than 1, indicating more than one repetition of the loop remains to be executed, state machine 36 sends a REPEAT1 command to the cache memory controller (step 122). If the value of M is equal to 1, indicating only one repetition of the loop remains to be executed, state machine 36 sends a LAST1 command to the cache memory controller (step 123). After step 122 or 123, state machine 36 signals LOOP1 counter 45_1 to decrement its output count M (step 124) and then waits for a next PCLK signal (step 125). Upon detecting that next PCLK signal pulse, it sets output multiplexer 42 to select LOOP1 FIFO buffer 40_2 as the source of the next OUT_INST (step 126) and pulses the SHIFT2 signal to shift LOOP1 FIFO buffer 40_2 (step 128). If (at step 130) state machine 36 has not detected N PCLK pulses since receiving the LOOP1_END instruction, state machine 36 returns to step 125. State machine 36 loops through steps 125–130 N times until it has shifted the LOOP1 FIFO buffer 40_2 N times. State machine 36 then sets output multiplexer 42 to select CACHE_INST as the OUT_INST source (step 131) and then returns to the main routine of FIG. 2.

Figure 7:
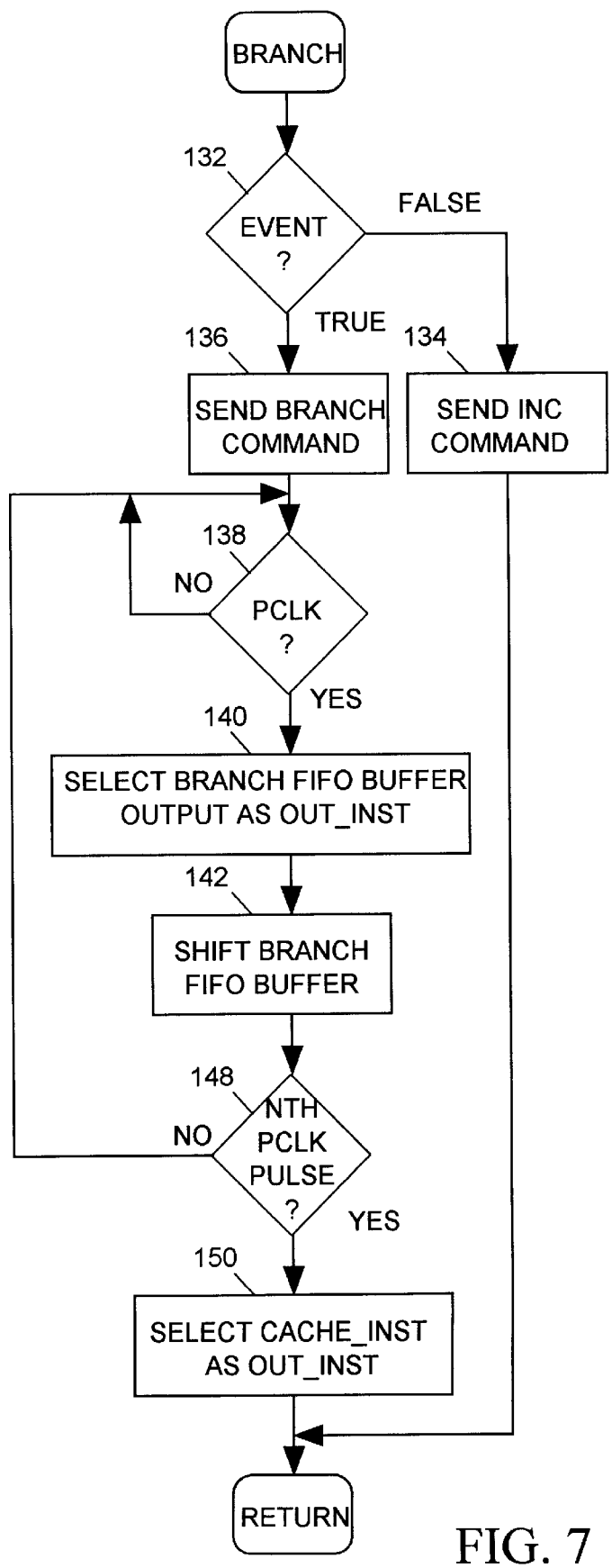

FIG. 7 illustrates the BRANCH routine state machine 36 executes at step 78 of FIG. 2 when the current OUT_INST instruction is a BRANCH instruction. If state machine 36 detects that its EVENT signal input is not asserted (step 132), it sends an INC command to memory controller 34 and returns to the main routine. However if the EVENT signal is asserted, state machine 36 sends a BRANCH command to the cache memory controller (step 136). State machine 36 then waits for a next PCLK signal (step 138). Upon detecting that next PCLK signal pulse, state machine 36 sets output multiplexer 42 to select BRANCH FIFO buffer 40_4 as the source of the next OUT_INST (step 140) and pulses the SHIFT4 signal to shift BRANCH FIFO buffer 40_4 (step 142). If (at step 148) state machine 36 has not detected N PCLK pulses since receiving the BRANCH instruction, state machine 36 returns to step 138. State machine 36 loops through steps 138–144 N times until it has shifted the BRANCH FIFO buffer 40_4 N times. At that point state machine 36 switches multiplexer 42 to select the cache memory as its source of output instructions (step 150) and then returns to the main routine of FIG. 2.

Memory Controller

Figure 8:
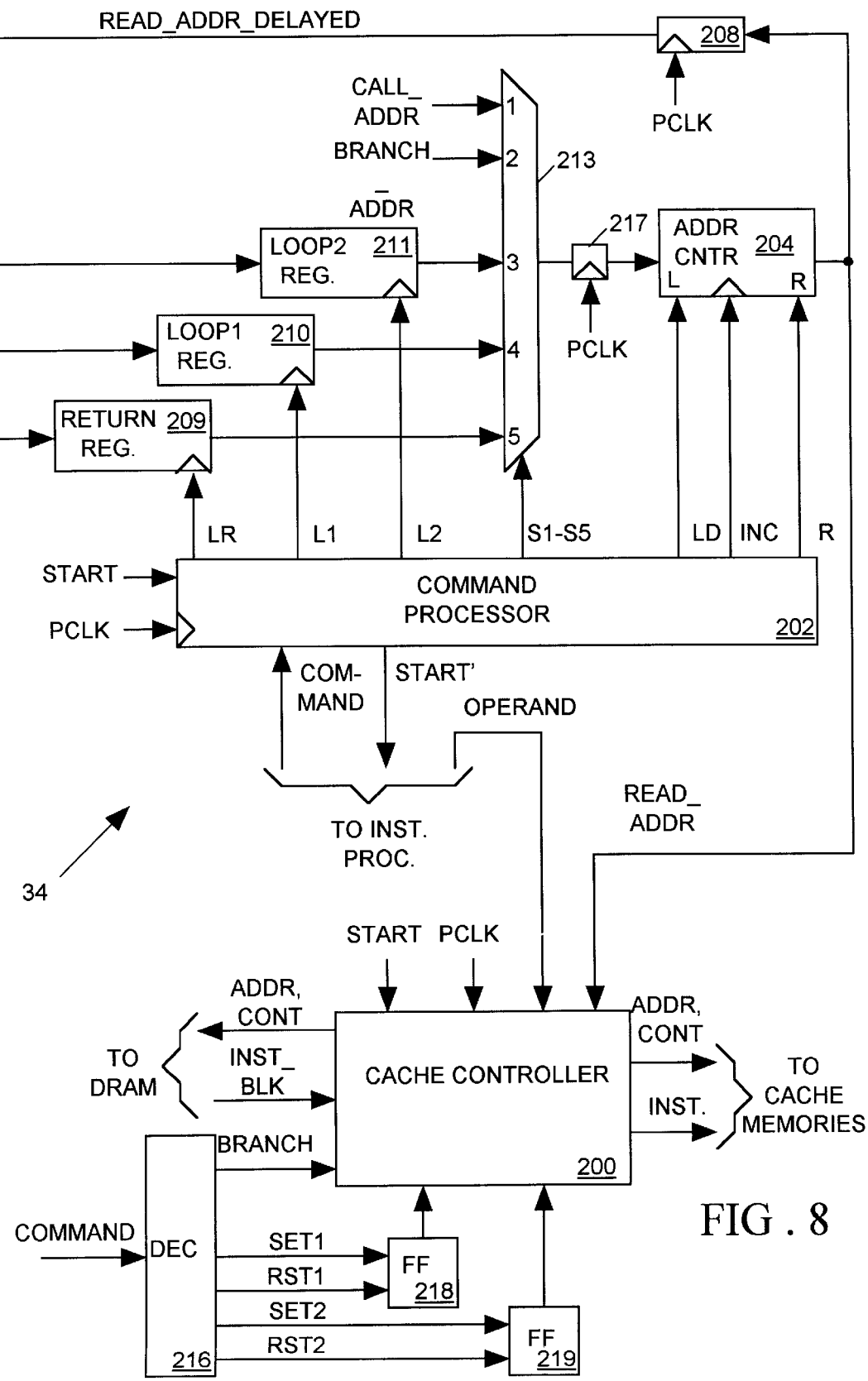

FIG. 8 illustrates memory controller 34 of FIG. 1 in more detailed block diagram form. After the host computer of FIG. 1 writes test instructions blocks to DRAM 12 of FIG. 1, it transmits a START signal to a cache controller 200. Cache controller 200 responds to the START signal by successively reading blocks of instructions out of DRAM 12 of FIG. 1 and writing them into appropriate locations of cache memories 38_1–38_4 in the manner discussed above.

The START signal is also applied to a command processor 202. Command processor 202 counts pulses of the PCLK signal to determine when cache controller 200 has had sufficient time to load the cache memories. Command processor 202 then sends a reset signal (R) to an address counter 204 causing it to set its output count (READ_ADDR) to zero. Each value of the READ_ADDR count output of address counter 204 references a separate address of one of cache memories 38_1–38_4 of FIG. 1. The initial zero value of READ_ADDR references the first memory address of cache memory 38_1. The READ_ADDR count provides an input to controller 200. In response to each pulse of the PCLK signal controller 200 supplies address and control signals to the appropriate one of cache memories 38_1–38_4 causing it to read out an instruction at the address referenced by the READ_ADDR output of counter 204 and to deliver it as the CACHE_INST instruction to instruction processor 16 of FIG. 1. Thereafter command processor 202 clocks counter 204 on each pulse of the PCLK signal causing it to increment its output address count.

Controller 200 has a pipeline architecture and requires a few PCLK cycles to cause the cache memory to read out each instruction after receiving the instruction's address (READ_ADDR) from counter 204. When a sufficient number of PCLK cycles have passed to allow the first instruction read out cache memory 38_1 to arrive at instruction processor 16, command processor 202 asserts the START' signal input to instruction processor 16, to tell it to begin receiving instructions.

Thereafter command processor 202 continues to clock counter 204 thereby causing controller 200 to successively address each cache memory 38_1–38_3. Whenever the output count of address counter 204 reaches a value referencing the last address of cache memory 38_3, it overflows to zero on the next clock pulse so that it now references the first storage location of cache memory 38_1.

The READ_ADDR output of counter 204 also provides an input to a register pipeline 208 clocked by the PCLK signal. Register pipeline 208 delays the signal by a few PCLK cycles and supplies it as input to a set of registers 209–211 controlled by command processor 202. When instruction processor 16 of FIG. 1 executes a subroutine CALL instruction, it sends a CALL command to command processor 202. Command processor 202 responds by loading the output (READ_ADDR_DELAYED) of register pipeline 208 into RETURN register 209. Command processor 202 delays the loading of RETURN register 209 for a few PCLK cycles until a time when READ_ADDR_DELAYED represents a cache address that is N+1 greater than the address of the CALL instruction. The address value stored in RETURN register 209 is therefore the address of the first instruction that is to be read out of the cache memories after returning from the called subroutine. Command processor 202 also responds to the CALL command by switching a multiplexer 213 so that it supplies a hardwired data value (CALL_ADDR) as input to address counter 204 via a clocked latch 217 and then pulses a load input to counter 204 causing it to load CALL_ADDR. The CALL_ADDR value references the first address of cache memory 38_4 of FIG. 1 which stores the called subroutine. After loading CALL_ADDR, address counter 204 thereafter counts up from the CALL_ADDR value when generating its output READ_ADDR value.

When instruction processor 16 of FIG. 1 subsequently executes a RETURN instruction it sends a RETURN command to command processor 202 telling it to load the contents of RETURN register 209 into counter 204.

When instruction processor 16 of FIG. 1 executes a LOOP1_START or LOOP2_START instruction, it sends a START1 or START2 command to command processor 202. Command processor 202 responds by loading the READ_ADDR_DELAYED value into LOOP1 register 210 or LOOP2 register 211 at a time when the READ_ADDR_DELAYED value references a cache address that is N+1 greater than the address of the executed LOOP1_START or LOOP2_START instruction. Thereafter, when instruction processor 16 sends a REPEAT1, END1, REPEAT2 or END2 command in response to a LOOP1_END or LOOP2_END instruction, command processor 202 loads the contents of LOOP1 register 210 or LOOP2 register 210 into address counter 204.

When instruction processor 16 of FIG. 1 sends a BRANCH command to command processor 202 in response to a BRANCH instruction, command processor 202 loads the first address of branch cache 38_5 into address counter 204 via multiplexer 213. A decoder 216 decodes the command and sends a BRANCH signal to cache controller 200 telling it to begin reading blocks of instructions out of DRAM 12 of FIG. 1 starting with the (N+M+1)th address following the branch address included in the branch instruction's OPERAND provided as input to cache controller 200. Cache controller 200 writes the branch instruction read out of DRAM 12 into main cache memories 38_1–38_3 starting with the first address of cache memory 38_1. After reading the last of M branch instructions out of the cache memory 38_5, command processor 202 jumps to the first address of 38_1 to obtain the next instruction.

The conventional cache memory read/write controller 200 monitors the READ_ADDR address count from counter 204 to determine when it references the last address of a block of address of one of cache memories 38_1–38_3. Normally when this happens, controller 200 reads out a next block of instructions from DRAM 12 and writes them over the instructions previously stored in that block of cache memory addresses. However when the cache memory system 14 is in the process of reading out a sequence of instructions that are a part of a repeating loop, it is necessary to prevent controller 200 from writing over any instructions included in the loop until the loop has been read out of the cache memories the required number of times. Accordingly a decoder 216 decodes the command output of instruction processor 16 to set or reset a pair of flip-flops 218 and 219. In response to a LOOP1 or LOOP2 command, decoder pulses a SET1 or SET2 signal to set flip-flop 218 and 219. The outputs of either flip-flop, when set, inhibit controller 200 from writing new instructions into any cache memory. In response to an END1 or END2 command generated by instruction processor 16 at the beginning of the last repetition of a loop, decoder 216 pulses a RST1 or RST2 signal to reset flip-flop 218 or 219, thereby allowing controller 202 to resume writing new instructions into the cache memory.

Command Processor

Figure 9:
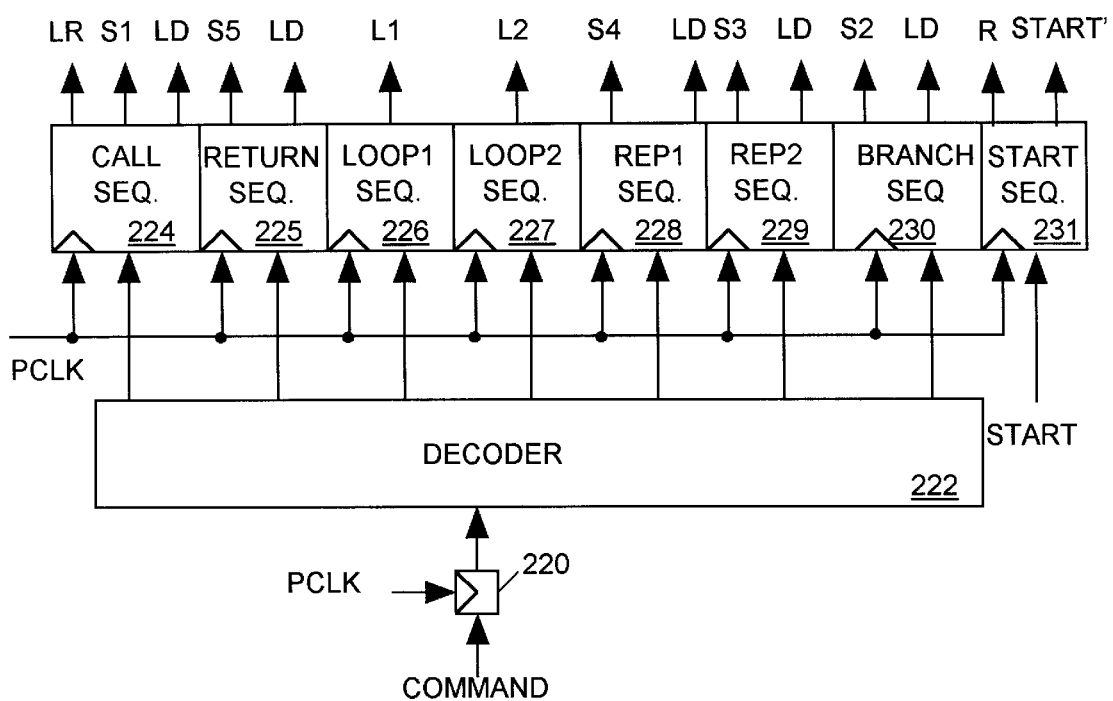

FIG. 9 illustrates command processor 202 of FIG. 8 in more detailed block diagram form. A latch 220 clocked by the PCLK signal latches the incoming command onto the input of a decoder 222. Decoder 222 decodes the command and generates an input signal to one of a set of sequencers 224–231 clocked by the PCLK signal.

Referring to FIGS. 8 and 9, A CALL command tells decoder 222 to signal sequencer 224. Sequencer 224 responds by generating a signal LR to load the READ_ADDR_DELAYED into return register 209. Sequencer 224 also asserts an S1 signal to tell multiplexer 213 to select the CAL_ADDR address and thereafter asserts an LD signal to load the CAL_ADDR address into counter 204.

A RETURN command tells decoder 222 to signal sequencer 225. Sequencer 225 responds by generating a signal S5 at the appropriate time to tell multiplexer 213 to select the return address stored in register 209 and thereafter asserts the LD signal to load that return address into counter 204.

A LOOP1 or LOOP2 command tells decoder 222 to signal sequencer 226 or sequencer 227 which respond by generating a signal L1 or L2 to load READ_ADDR_DELAYED into the LOOP1 register 210 or the LOOP2 register 211.

A REPEAT1, END1, REPEAT2 or END2 command tells decoder 222 to signal sequencer 228 or 229 which responds by generating a signal S4 or S3 at the appropriate time to tell multiplexer 213 to select the loop start address stored in register 210 or 211 and by thereafter asserting the LD signal to load that loop start address into counter 204.

A BRANCH command tells decoder 222 to signal sequencer 230. Sequencer 230 responds by generating an S2 signal to tell multiplexer 213 to select the branch address conveyed by the OPERAND output of register pipeline 214 and by thereafter asserting the LD signal to load the branch address into access counter 204.

The START command signals a START sequencer 231 which produces an output signal R to reset counter 204 when a sufficient number of PCLK cycles have passed for the cache controller 200 to have filled the cache memories with instructions. START sequencer 231 also pulses the START signal when the time the instruction stored at the first cache memory address arrives at instruction processor 16 of FIG. 1.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A pattern generator for producing a DATA value in response to each pulse of a sequence of input clock signal pulses, the pattern generator comprising:

a first memory (38) for storing an instruction in each of a plurality of first addressable storage locations and for reading out an instruction stored at any one of said first addressable storage locations referenced by a value of an address provided as input to said first memory;

a memory controller (34) for receiving said clock signal, for receiving a command referencing a particular address value, for providing said address input to said first memory, said memory controller changing a value of said address to the particular address value referenced by said command in response to an (N+1)th pulse of said clock signal occurring after said memory controller receives said command, wherein N is an integer greater than 0, and otherwise incrementing said input address in response to each pulse of said clock signal;

a buffer memory (39) for storing and reading out N instructions; and an instruction processor (16) for receiving said clock signal and each instruction read out of said first memory, for successively reading out and executing an instruction stored in said buffer memory in response to each of N pulses of said clock signal occurring after said memory controller receives said command, and for otherwise executing an instruction read out of the first memory in response to each pulse of said clock signal.

2. The pattern generator in accordance with claim 1 wherein at least one instruction read out of said first memory and executed by said instruction processor references said command, and wherein said instruction processor sends said command to said memory controller upon executing said at least one instruction.

3. The pattern generator in accordance with claim 2 further comprising a second memory for storing a plurality of instructions in each of a plurality of second addressable storage locations and for reading out the plurality instructions stored at any one of said second addressable storage locations referenced by a value of a second address provided as input to said second memory by said memory controller, said wherein memory controller writes each instruction of the plurality of instructions read out of said second memory into a separate first addressable storage location of said first memory.

4. The pattern generator in accordance with claim 3
wherein each executed instruction includes a DATA value
wherein said instruction processor provides the DATA value of each executed instruction as the pattern generator output data value, and
wherein said buffer memory receives and stores an instruction read out of said buffer memory in response to each of said N pulses of said clock signal occurring after said instruction processor.

5. The pattern generator in accordance with claim 1 wherein each executed instruction includes a DATA value, wherein said instruction processor provides the DATA value of each executed instructions as the pattern generator output DATA value.

6. The pattern generator in accordance with claim 1 wherein said buffer memory receives and stores an instruction read out of said first memory in response to each of said N pulses of said clock signal occurring after said instruction processor.

7. The pattern generator in accordance with claim 1 further comprising a second memory (12) for storing a plurality of instructions in each of a plurality of second addressable storage locations and for reading out the plurality instructions stored at any one of said second addressable storage locations referenced by a value of a second address provided as input to said second memory by said memory controller, wherein said memory controller writes each instruction of the plurality of instructions read out of said second memory into a separate first addressable storage location of said first memory.

8. A pattern generator for producing an output data value in response to each pulse of a sequence of input clock signal pulses, the pattern generator comprising:

a first memory (38) for storing an instruction in each of a plurality of first addressable storage locations and for reading out an instruction stored at any one of said first addressable storage locations referenced by a value of an address provided as input to said first memory;

a memory controller (34) for receiving said clock signal, for receiving input commands, each referencing a particular address value, for providing said address input to said first memory, said memory controller changing a value of said address to the particular address value referenced by any one said input commands in response to an (N+1)th pulse of said clock signal occurring after said memory controller receives said command, wherein N is an integer greater than 0, and otherwise incrementing said input address in response to each pulse of said clock signal;

a buffer memory (39) for storing instruction; and an instruction processor (16) for receiving said clock signal and each instruction read out of said first memory, for successively reading out and executing an instruction stored in said buffer memory in response to each of N pulses of said clock signal occurring after said memory controller receives said command, and for otherwise executing an instruction read out of the first memory in response to each pulse of said clock signal, wherein each instruction executed by said instruction processor includes a DATA value and an OPCODE referencing a command to be sent to the memory controller, said instruction processor sending the command referenced by the OPCODE executed instruction to said memory controller and providing the DATA value as the pattern generator output DATA value.

9. The pattern generator in accordance with claim 8
wherein said buffer memory includes a CALL buffer (40_1) and a RETURN buffer (40_5), each for storing instructions;
wherein the OPCODE of one instruction executed by said instruction processor references a CALL command, and wherein the OPCODE of another instruction executed by said instruction processor references a RETURN command,
wherein after executing said one instruction, said instruction processor responds to each of a next N pulses of said clock signal by writing an instruction read out of said first memory into said RETURN buffer, reading another instruction out of said CALL buffer, and executing said another instruction, and
wherein in response to a pulse of said clock signal following said next N pulses, said instruction processor executes an instruction read out of said first memory.

10. The pattern generator in accordance with claim 9
wherein said memory controller includes a RETURN register (209), wherein in response to an (N+1)th clock signal pulse after receiving a CALL command, said memory controller stores a return address in said RETURN register and then changes the value of the address input to said first memory to a value referenced by said CALL command, and wherein in response to an (N+1)th clock signal pulse after receiving a RETURN command, said memory controller changes a value of the address input to said first memory to the return address stored in said RETURN register.

11. The pattern generator in accordance with claim 8 wherein said buffer memory 39 includes a LOOP buffer (40_2) for storing instructions;

wherein the OPCODE of one instruction executed by said instruction processor references a LOOP_START command and wherein an opcode of another instruction executed by said instruction processor references a LOOP_REPEAT command, wherein after executing said one instruction, said instruction processor responds to each of a next N pulses of said clock signal writing executed instructions into said LOOP buffer, and wherein after executing said another instruction, said instruction processor responds to each of a next N pulses of said clock signal by reading an instruction read out of said LOOP buffer and executing said instruction read out of said LOOP buffer.

12. The pattern generator in accordance with claim 11 wherein said memory controller includes a LOOP register (210), wherein in response to an (N+1)th clock signal pulse after receiving a START command, said memory controller stores a value of the address input to said first memory in said START register and then increments the address input to said first memory, and wherein in response to an (N+1)th clock signal pulse after receiving a REPEAT command, said memory controller changes a value of the address input to said first memory to a value stored in said LOOP register.

13. The pattern generator in accordance with claim 8 wherein said buffer memory includes a BRANCH buffer (40_4) for storing instructions;

wherein the OPCODE of one instruction executed by said instruction processor references a BRANCH command and wherein said one instruction includes an OPERAND referencing a memory address, wherein after executing said one instruction, said instruction processor responds to each of a next N pulses of said clock signal by reading an instruction read out of said BRANCH buffer and executing said instruction read out of said BRANCH buffer.

14. The pattern generator in accordance with claim 13 wherein in response to an (N+1)th clock signal pulse after receiving a BRANCH command, said memory controller changes the address input to said first memory to a value indicated by said OPERAND.

15. The pattern generator in accordance with claim 8 wherein said buffer memory includes a CALL buffer (40_1), a LOOP buffer (40_2) a BRANCH buffer (40_4) and a RETURN buffer (40_5) each for storing instructions;

wherein said memory controller includes a RETURN register (209) and a LOOP register (210), wherein the OPCODE of a first instruction executed by said instruction processor references a CALL command, wherein the OPCODE of a second instruction executed by said instruction processor references a RETURN command, wherein the OPCODE of a third instruction executed by said instruction processor references a LOOP_START command, wherein the OPCODE of a fourth instruction executed by said instruction processor references a LOOP_REPEAT command, wherein the OPCODE of a fifth instruction executed by said instruction processor references a BRANCH command, and wherein fifth instruction includes an OPERAND referencing a memory address, wherein after executing said first instruction, said instruction processor responds to each of a next N pulses of said clock signal by writing an instruction read out of said first memory into said RETURN buffer, reading another instruction out of said CALL buffer, and executing said another instruction, and responds to a next pulse of said clock signal by executing an instruction read out of said first memory, wherein after executing said third instruction, said instruction processor responds to each of a next N pulses of said clock signal by writing executed instructions into said LOOP buffer, wherein after executing said fourth instruction, said instruction processor responds to each of a next N pulses of said clock signal by reading an instruction read out of said LOOP buffer and executing said instruction read out of said LOOP buffer, wherein after executing said fifth instruction, said instruction processor responds to each of a next N pulses of said clock signal by reading an instruction read out of said BRANCH buffer and executing said instruction read out of said BRANCH buffer, wherein in response to an (N+1)th clock signal pulse after receiving a CALL command, said memory controller stores a value of the address input to said first memory in said RETURN register and then changes the value of the address input to said first memory to a value referenced by said CALL command, wherein in response to an (N+1)th clock signal pulse after receiving a RETURN command, said memory controller changes a value of the address input to said first memory to a value stored in said RETURN register, wherein in response to an (N+1)th clock signal pulse after receiving a START command, said memory controller stores a value of the address input to said first memory in said START register and then increments the address input to said first memory, and wherein in response to an (N+1)th clock signal pulse after receiving a REPEAT command, said memory controller changes a value of the address input to said first memory to a value stored in said LOOP register, and wherein in response to an (N+1)th clock signal pulse after receiving a BRANCH command, said memory controller changes the address input to said first memory to a value indicated by said OPERAND.

16. The pattern generator in accordance with claim 15 further comprising a second memory (12) for storing a plurality of instructions in each of a plurality of second addressable storage locations and for reading out the plurality instructions stored at any one of said second addressable storage locations referenced by a value of a second address provided as input to said second memory by said memory controller, wherein said memory controller writes each instruction of the plurality of instructions read out of said second memory into a separate first addressable storage location of said first memory.

* * * * *